(12) United States Patent
Luo et al.

(10) Patent No.: US 12,426,509 B2
(45) Date of Patent: Sep. 23, 2025

(54) METHOD FOR PREPARING STATIC/DYNAMIC 3D MICROCRACK PROPAGATION SENSOR, SENSOR AND EQUIPMENT

(71) Applicant: QINGDAO UNIVERSITY OF TECHNOLOGY, Shandong (CN)

(72) Inventors: Jianlin Luo, Qingdao (CN); Xiaoyang Zhou, Qingdao (CN); Huarong Nie, Qingdao (CN); Yibo Gao, Qingdao (CN); Zhiqing Li, Qingdao (CN); Min Zhu, Qingdao (CN)

(73) Assignee: QINGDAO UNIVERSITY OF TECHNOLOGY, Qingdao (CN)

( * ) Notice: Subject to any disclaimer, the term of this patent is extended or adjusted under 35 U.S.C. 154(b) by 504 days.

(21) Appl. No.: 18/084,660

(22) Filed: Dec. 20, 2022

(65) Prior Publication Data
US 2023/0200247 A1 Jun. 22, 2023

(30) Foreign Application Priority Data
Dec. 21, 2021 (CN) .......................... 202111573281.6

(51) Int. Cl.
*H10N 30/30* (2023.01)
*G01N 3/08* (2006.01)

(52) U.S. Cl.
CPC ............ *H10N 30/302* (2023.02); *G01N 3/08* (2013.01); *G01N 2203/0066* (2013.01); *Y10T 29/42* (2015.01)

(58) Field of Classification Search
CPC .. H10N 30/302; H10N 30/045; H10N 30/092; Y10T 29/42

(Continued)

(56) References Cited

U.S. PATENT DOCUMENTS

| 7,262,861 | B1 * | 8/2007 | Pepper | ................... | G01B 17/02 |
| | | | | | 356/502 |
| 11,891,335 | B2 * | 2/2024 | Li | ......................... | C04B 14/022 |

FOREIGN PATENT DOCUMENTS

| CN | 105953821 B | 11/2018 |
| CN | 111721192 B | 12/2020 |
| CN | 113074622 A | 7/2021 |

* cited by examiner

*Primary Examiner* — Thiem D Phan
(74) *Attorney, Agent, or Firm* — Oliff PLC

(57) ABSTRACT

A method for preparing a static/dynamic three-dimensional (3D) microcrack propagation sensor, a sensor and equipment, belongs to the field of sensor technology. The preparation method includes: preparing a piezoresistive/piezoelectric sensing functional component dispersed material, and then coating the dispersed material to the surface of a fiber cloth substrate to obtain a piezoresistive/piezoelectric sensing fiber cloth; performing a pre-stretching treatment on the piezoresistive/piezoelectric sensing fiber cloth to obtain a piezoresistive/piezoelectric sensing 3D microcrack fiber cloth; ablating the piezoresistive/piezoelectric sensing 3D microcrack fiber cloth by microwave to remove the fiber cloth substrate, then obtaining a piezoresistive/piezoelectric sensing 3D microcrack functional skeleton; coating a conductive layer on both surfaces of the piezoresistive/piezoelectric sensing 3D microcrack functional skeleton, thereby forming an electrode; polarizing the piezoresistive/piezoelectric sensing 3D microcrack functional skeleton with the formed electrodes on the surfaces; and, encapsulating the piezoresistive/piezoelectric sensing 3D microcrack functional skeleton to obtain a static/dynamic 3D microcrack propagation sensor.

10 Claims, 2 Drawing Sheets

(58) Field of Classification Search
USPC .................................... 29/25.35, 592.1, 841
See application file for complete search history.

METHOD FOR PREPARING STATIC/DYNAMIC 3D MICROCRACK PROPAGATION SENSOR, SENSOR AND EQUIPMENT

CROSS-REFERENCES TO RELATED APPLICATIONS

This application claims priority benefits to Chinese Patent Application No. 202111573281.6, filed 21 Dec. 2021, the contents of which are incorporated herein by reference.

TECHNICAL FIELD

The present invention belongs to the field of sensor technology, and in particular, relates to a method for preparing a static/dynamic three-dimensional (3D) microcrack propagation sensor, a sensor and equipment.

BACKGROUND

The statements in this section merely provide background technical information related to the present invention and do not necessarily constitute prior art.

Sensors are a key link to achieving structural health monitoring, and intrinsic sensing blocks are made by mixing piezoresistive/piezoelectric materials such as piezoresistive materials (e.g. graphite, carbon black, carbon fiber, carbon nanotubes, graphene) and piezoelectric ceramics (e.g. lead titanate, zinc oxide, lead zirconate titanate) into cement concrete; while the cement-based piezoelectric sensing blocks need to undergo a series of processes such as mixing, pressing, and polarizing, and then are embedded in various structural systems, of which the operation is complicated and not suitable for actual construction. Meanwhile, with the development of sensing functional components, the materials such as resistance strain gauges (filaments), piezoelectric ceramics, fatigue life filaments, shape memory alloys, and fiber optic gratings have appeared one after another; however, these sensing devices for the engineering field, either need to be buried in the structural system with the burial process is complicated and the survival rate thereof is low, or of which the cost is high and the life is short, or of which the anti-interference ability is poor and the corrosion resistance is poor, or of which the compatibility with concrete is poor, which in turn affect the structural mechanical properties.

Compared with the above intrinsic sensing blocks, the flexible sensing film can be prepared in advance to eliminate the on-site fabrication, and can be well affixed to the surface and inside of the structure, adapting to the requirements of various special sizes and shapes of structures, and the sticking on the structure has little effect on the performance of the sensing material itself.

The flexible sensing thin film sensors can be divided into four types according to their working principles: piezoresistive, capacitive, piezoelectric and triboelectric. Capacitive sensors have a small initial capacitance and are susceptible to the random parasitic capacitance of the measurement circuit and surrounding conductors, making them less stable in operation. Triboelectric sensors have strict packaging requirements in practical applications, and attention should be paid to waterproof and moisture-proof treatment. In addition, the triboelectric effect of the triboelectric sensor will decline with the increase in working time, so its mechanical stability is poor. Piezoresistive sensors and piezoelectric sensors are simple, low-cost, and stable sensing performance, so they are more applicable in the field of structural health monitoring compared to capacitive sensors and triboelectric sensors.

However, piezoresistive thin film sensors can only detect the static signal of the structure, but cannot sense the deformation state of the structure, and are not sensitive to the strain rate. While the piezoelectric thin film sensors, although the response thereof is rapid, is only suitable for detecting dynamic signals, such as transient force changes and deformation rates, and cannot reflect the final strain state. Therefore, single-mode piezoresistive thin film sensors or piezoelectric thin film sensors will cause information loss during the detection of static/dynamic signals in the structure. To solve these problems, a static/dynamic dual-mode sensor is proposed.

Chinese patent CN105953821B discloses a piezoresistive/piezoelectric sandwich-type sensor for the first time, including: a tenacious substrate, 5-50 self-assembly film piezoresistive perception function layer double-layers (i.e., top/bottom electrode layers), and a piezoelectric perception elastic core sandwich function layer which is prepared by a nanometer ZnO/PDMS or PVDF/PDMS, capable of static signal and dynamic signal to achieve effective monitoring, but the poor flexibility of the zinc sheet, when the working surface is shaped, the stick effect is not ideal, and the mechanical stability of the encapsulated elastomer and conductive layer under the action of external forces is not enough, the conductive layer is easy to be separated from the elastomer to lose its role. At the same time, due to the thick film and poor sensitivity of this type of sensors, it is difficult to have high sensitivity and high flexibility at the same time.

SUMMARY

For overcoming the above technical problems in the background technology, the present invention provides a method for preparing a static/dynamic 3D microcrack propagation sensor, a sensor and equipment, which is suitable for structural monitoring, and has the characteristics of high flexibility, fast and sensitive perception of static and dynamic signals.

To achieve the above purpose, the present invention uses the following technical solutions.

It is a first aspect of the present invention to provide a method for preparing a static/dynamic 3D microcrack propagation sensor, comprising:

preparing a piezoresistive/piezoelectric sensing functional component dispersed material, and then coating the dispersed material to the surface of a fiber cloth substrate to obtain a piezoresistive/piezoelectric sensing fiber cloth;

performing a pre-stretching treatment on the piezoresistive/piezoelectric sensing fiber cloth to obtain a piezoresistive/piezoelectric sensing 3D microcrack fiber cloth;

ablating the piezoresistive/piezoelectric sensing 3D microcrack fiber cloth by microwave to remove the fiber cloth substrate, and then obtaining a piezoresistive/piezoelectric sensing 3D microcrack functional skeleton;

coating a conductive layer on both surfaces of the piezoresistive/piezoelectric sensing 3D microcrack functional skeleton, thereby forming an electrode;

polarizing the piezoresistive/piezoelectric sensing 3D microcrack functional skeleton with the formed electrodes on the surfaces; and encapsulating the piezoresistive/piezoelectric sensing 3D microcrack functional skeleton with an elastomer to obtain a static/dynamic 3D microcrack propagation sensor.

As an implementation, during the polarization of the piezoresistive/piezoelectric sensing 3D microcrack functional skeleton with the formed electrodes on the surfaces, laminating a conductor with a set thickness and an area thereof equal to the area of the coated silver adhesive on the top of the piezoresistive/piezoelectric sensing 3D microcrack functional skeleton, and then placing them together between the point contact electrode and the bottom electrode of a polarization device for the polarization process.

As an implementation, the process of preparing the piezoresistive/piezoelectric sensing functional component dispersed material comprises:

preparing a piezoelectric functional component precursor solution; and mixing, dissolving and dispersing the material with piezoresistive function in the piezoelectric functional component precursor solution via surfactant sonication method to obtain the piezoresistive/piezoelectric sensing functional component dispersed material.

As an implementation, the conductive layer coated on both surfaces of the piezoresistive/piezoelectric sensing 3D microcrack functional skeleton is a conductive silver adhesive.

As an implementation, the piezoresistive functional component is one or a mixture of CNT, GO, GO-grafted carbon fiber, GO-grafted carbon nano fiber, and GnP.

As an implementation, the piezoelectric functional component is a PZT precursor/powder, a nano-ZnO precursor/powder, or an aluminum nitride powder.

As an implementation, the fiber cloth substrate is synthetic fabric or cotton fabric.

As an implementation, before coating the conductive layer on both surfaces of the piezoresistive/piezoelectric sensing 3D microcrack functional skeleton, further comprising: cleaning the piezoresistive/piezoelectric sensing 3D microcrack functional skeleton.

As an implementation, after polarizing the piezoresistive/piezoelectric sensing 3D microcrack functional skeleton with the formed electrodes on the surfaces, further comprising:

removing silicone oil from the surfaces of the piezoresistive/piezoelectric sensing 3D microcrack functional skeleton.

It is a second aspect of the present invention to provide a static/dynamic 3D microcrack propagation sensor, which is obtained by adopting a method for preparing the static/dynamic 3D microcrack propagation sensor as described above.

It is a third aspect of the present invention to provide a structure monitoring equipment comprising a static/dynamic 3D microcrack propagation sensor as described above.

Compared with the prior art, the beneficial effects of the present invention are:

(1) According to the present invention, providing a method for preparing a static/dynamic 3D microcrack propagation sensor, comprising: attaching the dispersed material of the piezoresistive/piezoelectric sensing functional component to the flexible fiber cloth; generating 3D annular microcracks by pre-stretching, and making a 3D convoluted tubular skeleton by microwave ablation; and then obtaining a crack sensor being stuck on the surface or inside the structure after coating electrodes, polarization, and elastomer encapsulation, to make the static/dynamic 3D microcrack propagation sensor has the characteristics of high sensitivity of piezoresistive-piezoelectric dual-mode and high voltage coefficient, and the advantages of 3D crack sensing capability, good flexibility, flexible size adjustment, good static/dynamic sensing stability and so on; and the performance of the structure and materials will not be affected by sticking on the structure, and by being tightly adhered to the surface of the structure, the fast and stable monitoring of static/dynamic performance index parameters of the structural covering the whole frequency domain is realized.

(2) According to the present invention, coating the dispersed material of the piezoresistive/piezoelectric sensing functional component to the flexible fiber substrate, generating the skeleton structure utilizing the fiber structure of the fiber cloth, removing the flexible fiber cloth substrate by microwave ablation, and the elastomer can be interwoven with the skeleton through the skeleton gap, which ensure that the sensor may have enough sufficient mechanical stability when the external force is applied, and avoid that the problem of the poor mechanical stability of the sensor caused by separation due to the difference in mechanical properties, etc. between the sensing function layer and the flexible fiber cloth substrate or between the sensing function layer and the elastomer, while removing the flexible fiber cloth substrate is beneficial to the improvement of sensitivity; the smaller pre-tension strain can produce 3D microcrack, so that the final prepared sensor can respond to small external disturbances, that is, the change of contact resistance caused by the change of spacing between many 3D microcracks; while the sensing function material may be in a 3D coiled tube shape after the fiber being removed by the microwave ablation, and then the fiber cloth being disposed of by the microwave ablation again and being filled with elastomer to further avoid the failure of the sensor caused by debonding of functional components and fiber cloth under static and dynamic loads; under the triple action, the static/dynamic 3D microcrack propagation sensor has higher sensitivity, which solves the problem that the crack in the sensor layer of the crack sensor is generally a two-dimensional plane structure, limiting the sensor sensitivity. Therefore, the resulting sensor has both high piezoresistive-piezoelectric dual-mode sensitivity and flexibility.

The advantages of additional aspects of the present invention will be set forth in part in the description which follows, and in part will be obvious from the description, or may be learned by practice of the present invention.

BRIEF DESCRIPTION OF THE DRAWINGS

The accompanying drawings constituting a part of the present invention are used to provide a further understanding of the present invention. The exemplary examples of the present invention and descriptions thereof are used to explain the present invention, and do not constitute an improper limitation of the present invention.

Wherein: 1-piezoresistive/piezoelectric sensing 3D microcrack functional layer; 2-3D microcrack; 3-encapsulation layer; 4-electrode.

DETAILED DESCRIPTION

The present invention will now be further described with reference to the accompanying drawings and examples.

It should be pointed out that the following detailed descriptions are all illustrative and are intended to provide further descriptions of the present invention. Unless otherwise specified, all technical and scientific terms used in the present invention have the same meanings as those usually understood by a person of ordinary skill in the art to which the present invention belongs.

It should be noted that the terms used herein are merely used for describing specific implementations, and are not intended to limit exemplary implementations of the present invention.

As used herein, the singular form is also intended to include the plural form unless the context clearly dictates otherwise. In addition, it should further be understood that, terms "comprise" and/or "comprising" used in this specification indicate that there are features, steps, operations, devices, components, and/or combinations thereof.

Example 1

Figure 1:
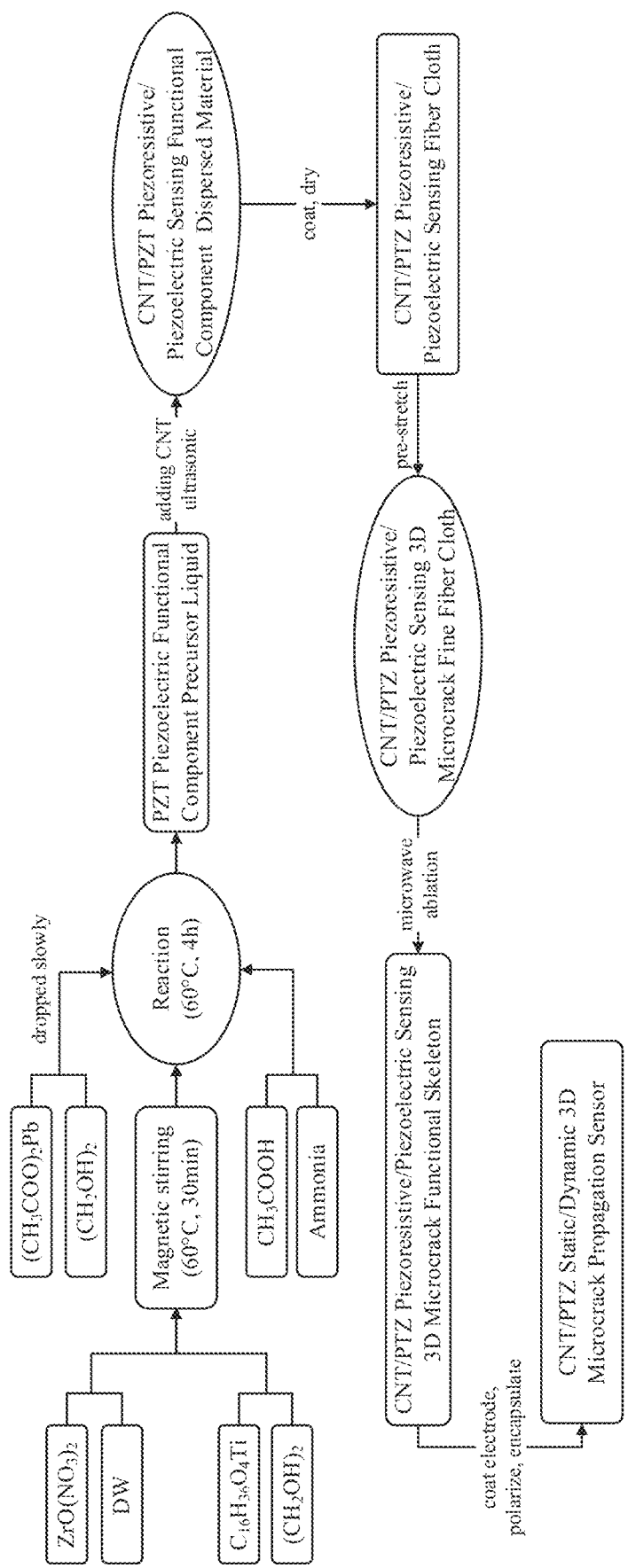
FIG. 1 is a process for preparing a static/dynamic 3D microcrack propagation sensor of an example of the present invention.

Referring to FIG. 1, the present example provides a method for preparing a static/dynamic 3D microcrack propagation sensor, comprising:

Step 1: preparing a piezoresistive/piezoelectric sensing functional component dispersed material, and then coating the dispersed material to the surface of a fiber cloth substrate to obtain a piezoresistive/piezoelectric sensing fiber cloth.

In the step 1, the process of preparing the piezoresistive/piezoelectric sensing functional component dispersed material comprises:

preparing a piezoelectric functional component precursor solution; and mixing, dissolving and dispersing the material with piezoresistive function in the piezoelectric functional component precursor solution via surfactant sonication method to obtain the piezoresistive/piezoelectric sensing functional component dispersed material.

Wherein, the formulation of the piezoelectric functional component precursor solution can be configured by the sol-gel method known to those skilled in the art. The piezoresistive functional component is one or a mixture of CNT, GO, GO-grafted carbon fiber, GO-grafted carbon nano fiber, and GnP; the piezoelectric functional component is a PZT precursor/powder, a nano-ZnO precursor/powder, or an aluminum nitride powder.

In one example, the CNT is selected for the piezoresistive functional component and the PZT precursor/powder is selected for the piezoelectric functional component, and a process for preparing the precursor solution is:

dissolving 36 parts of zirconyl nitrate in 500 parts of distilled water, 49 parts of butyl titanate in 200 parts of ethylene glycol, and 107 parts of lead acetate in 230 parts of ethylene glycol, then mixing the aqueous zirconyl nitrate solution and butyl titanate-ethylene glycol solution at 60° C. with magnetic stirring for 30 min, adding the lead acetate-ethylene glycol solution by slowly dropping in, and then adding glacial acetic acid and ammonia to adjust the pH value to 4.6, and continuing the reaction for 4 h at 60° C. to obtain the PZT piezoelectric functional component precursor solution;

adding 2 parts of the CNT into the PZT piezoelectric functional component precursor solution, then obtaining a CNT/PZT piezoresistive/piezoelectric sensing functional component dispersed material after being treated using ultrasonic treatment with 200 W probe for 30 min.

Wherein, the fiber cloth substrate is fiber fabric or cotton fabric. The fiber fabric may be a polyurethane (PU) fiber cloth, a polyamide fiber cloth, etc., with low elastic modulus.

Specifically, the prepared piezoresistive/piezoelectric sensing functional component dispersed material made can be attached to the surface of the flexible fiber cloth substrate by adopting methods known to those skilled in the art, such as dipping and lifting, hand coating and spray gun coating, and then the piezoresistive/piezoelectric sensing fiber cloth is obtained by adopting method of heating and volatilizing or natural shade drying.

In one example, the process of introducing the CNT/PZT piezoresistive/piezoelectric sensing functional component into the fiber cloth substrate is as follows:

Step 1.1: cutting the fiber cloth into long strips (e.g., 10-70 mm), laying the fiber cloth flat in a container, and securing the ends thereof with tapes; at the same time, preparing the piezoelectric functional component precursor solution containing 20% PZT, and then mixing and dispersing materials with piezoresistive function which contains 0.3% carbon nanotubes in the piezoelectric functional component precursor solution using surfactant sonication method (ultrasonic frequency 40 kHz, 5 s interruption per 55 s, total 3 h) to obtain the piezoresistive/piezoelectric sensing functional component dispersed material;

Step 1.2: spraying the CNT/PZT piezoresistive/piezoelectric sensing functional component dispersed material obtained from step 1.1 evenly on the fiber cloth adopting a spray paint coating method, wherein only a range of 50 mm in the middle is sprayed, a spraying pressure of spray paint is 0.2 MPa, and spraying at 15 cm from the fiber cloth with spray gun for 15 s;

Step 1.3: setting the temperature of a thermostat table to 60-80° C., placing the container containing fiber cloth on the thermostat table and placing them together in a fume hood to volatilize for 1-2 h; after the ammonia volatilizes, placing in a vacuum drying oven at 100° C. for 3-5 h to remove the water, then raising the temperature of the thermostat table to 120° C. and keeping for 1-2 h to remove the glacial acetic acid; finally, raising the temperature of the thermostat table to 200° C. and keeping for 3-6 h to remove the ethylene glycol.

Step 1.4: repeating step 1.2 and step 1.3 for spraying the other side of the fiber cloth to obtain the CNT/PZT piezoresistive/piezoelectric sensing fiber cloth.

Step 2: performing a pre-stretching treatment on the piezoresistive/piezoelectric sensing fiber cloth to obtain a piezoresistive/piezoelectric sensing 3D microcrack fiber cloth.

stretching the piezoresistive/piezoelectric sensing fiber cloth to a certain extent by means of film pre tensioning, roller bending, material tensile testing machine or manual pre stretching, so as to form 3D microcracks in the piezoresistive/piezoelectric sensing functional components coated to the surfaces of the flexible fiber cloth substrate, and then obtaining the piezoresistive/piezoelectric sensing 3D microcrack fiber cloth.

In the present example, the CNT/PZT piezoresistive/piezoelectric sensing fiber cloth is pre-stretched by being clamped on a stretching jig and using a material stretching experiment machine, wherein a stretching rate is set to 5 mm/min, a pre-stretching strain is set to 7% (42 s), setting a duration of the stretching process (e.g., 42 s) and a maintenance time after the stretching ends (e.g., 30 s), then obtaining the CNT/PZT piezoresistive/piezoelectric sensing 3D micro cracked fiber cloth.

Step 3: carrying out microwave ablation on the piezoresistive/piezoelectric sensing 3D microcrack fiber cloth to remove the fiber cloth substrate, and then obtaining a piezoresistive/piezoelectric sensing 3D microcrack functional skeleton.

For example, the piezoresistive/piezoelectric sensing 3D microcrack fiber cloth is ablated with 700-1500 W microwave for 30-40 s to obtain the piezoresistive/piezoelectric sensing 3D microcrack functional skeleton.

In the present example, the CNT/PZT piezoresistive/piezoelectric sensing 3D microcrack functional skeleton is obtained by processing the obtained CNT/PZT piezoresistive/piezoelectric sensing 3D microcrack fiber cloth by 1000 W microwave for 30 s to remove the flexible fiber cloth substrate.

Step 4: coating a conductive layer on both surfaces of the piezoresistive/piezoelectric sensing 3D microcrack functional skeleton, thereby forming an electrode. Wherein, the conductive layer coated on both surfaces of the piezoresistive/piezoelectric sensing 3D microcrack functional skeleton is a conductive silver adhesive.

For example, the conductive silver adhesive is applied to the surface of the piezoresistive/piezoelectric sensing 3D microcrack functional skeleton by methods known to those skilled in the art, such as hand coating or vacuum vapor deposition, to form crossed finger-shaped electrodes or striped electrodes.

Before coating the conductive layer on both surfaces of the piezoresistive/piezoelectric sensing 3D microcrack functional skeleton, further comprising:

cleaning the piezoresistive/piezoelectric sensing 3D microcrack functional skeleton. For example: cleaning with anhydrous ethanol.

In one example, cleaning the obtained CNT/PZT piezoresistive/piezoelectric sensing 3D microcrack functional skeleton with anhydrous ethanol, and then slowly soaking and smearing one surface of the film with the conductive silver adhesive by using a fine brush which has dipped with a low-temperature conductive silver adhesive, after that, sticking a wire on, and being dried at 60° C. for 30 min; after drying, smearing the other surface of the CNT/PZT piezoresistive/piezoelectric sensing 3D microcrack functional skeleton.

Step 5: polarizing the piezoresistive/piezoelectric sensing 3D microcrack functional skeleton with the formed electrodes on the surfaces.

In a specific implementation, during the polarization of the piezoresistive/piezoelectric sensing 3D microcrack functional skeleton with the formed electrodes on the surfaces, laminating a conductor with a set thickness and an area thereof equal to the area of the coated silver adhesive on the top of the piezoresistive/piezoelectric sensing 3D microcrack functional skeleton, and then placing them together between the point contact electrode and the bottom electrode of a polarization device for the polarization process, so that the piezoresistive/piezoelectric sensing 3D microcrack skeleton may be prevented from being broken through.

Specifically, after polarizing the piezoresistive/piezoelectric sensing 3D microcrack functional skeleton with the formed electrodes on the surfaces, further comprising:

removing silicone oil from the surfaces of the piezoresistive/piezoelectric sensing 3D microcrack functional skeleton.

For example: removing the silicone oil from the surfaces of the piezoresistive/piezoelectric sensing 3D microcrack functional skeleton with anhydrous ethanol.

In one example, placing the CNT/PZT piezoresistive/piezoelectric sensing 3D microcrack functional skeleton coated with electrodes in silicone oil at 60° C., polarizing it at 50 MV/m for 1 h, then cooling it to room temperature under an applied electric field, and then removing the silicone oil on the surfaces by cleaning with anhydrous ethanol after polarization and standing for 24 h.

Step 6: encapsulating the piezoresistive/piezoelectric sensing 3D microcrack functional skeleton to obtain a static/dynamic 3D microcrack propagation sensor.

In step 6, the piezoresistive/piezoelectric sensing 3D microcrack functional skeleton is encapsulated using an elastic encapsulation layer.

Adopting methods well known to those skilled in the art and using elastic encapsulation layers such as polydimethylsiloxane (PDMS), polyacrylate, polyurethane, super-soft silicone rubber, EPDM rubber and hydrogel-like materials to encapsulate the piezoresistive/piezoelectric sensing 3D microcrack functional skeleton, to finally obtain a static/dynamic 3D microcrack propagation sensor.

For example, placing the CNT/PZT piezoresistive/piezoelectric sensing 3D microcrack functional skeleton in a silicone mold with prior brushing release agent, wherein the size of the silicone mold is 90×20×3 mm; mixing a PDMS main agent with a curing agent at a mass ratio of 10:1, stirring slowly when mixing; allowing the mixture to stand for 30 min before potting, then injecting the PDMS into the mold, and allowing the mold to stand for 15-30 min after potting to drain the foam, and then heating and curing at 60° C. for 4 h, and finally obtaining the CNT/PZT static/dynamic 3D microcrack propagation sensor.

Piezoelectric strain coefficients $d_{33}$ and $d_{31}$ of the polarized CNT/PZT piezoresistive/piezoelectric sensing 3D microcrack functional skeleton measured by a quasi-static $d_{33}/d_{31}$ measuring instrument are −19.8 pC/N and −23 pC/N, respectively. Combining Wheatstone bridge technology and DaspV11 dynamic signal acquisition technology, the resistivity change of the sensor stuck in the simply supported beam system under the condition of three-point bending at the mid span is studied, and under the action of static strain, the sensitivity is 294 and the linearity is 0.999; under the action of dynamic strain, the sensitivity of sensor voltage change is 180, and the linearity is 0.99, so that the structural strain in the range of 0-60% can be sensitively sensed. 2 kHz dynamic pressure (2.44 kPa) is applied to the sensor to test the cycle stability, and the corresponding output voltage is recorded through the static/dynamic signal acquisition instrument, and the records show that after 5000 cycles, during the whole stability test, the output voltage of the sensor is almost constant, the performance of the sensor is not degraded, the entire sensor remains intact, and no damage is found to the surface flexible seal.

Example 2

The present example provides a method for preparing a static/dynamic 3D microcrack propagation sensor, which differs from Example 1 is that the piezoresistive/piezoelectric sensing functional component in Step 1 is different, and all other steps are similar to Example 1.

In the present example, a process for preparing a CNT piezoresistive sensing functional component dispersed material is:

adding 3 parts of CTAB and 1 part of CNT into 500 parts of deionized water, soaking the dispersing liquid in ultrasonic for 5 min, and ultrasonic for 30 min with a 200 W probe to obtain a CNT slurry.

A process of introducing the CNT piezoresistive sensing functional component into a fiber cloth substrate is: refer to steps 1.1 and 1.2 in Example 1, drying at 80° C. for 15 min after spraying, and then repeat step 1.4.

A process of introducing a nano-ZnO piezoelectric sensing functional component comprises:

dispersing 100 parts of PDMS main agent and 50 parts of ZnO nano-powder evenly by ultrasonic (ultrasonic energy is 5 kJ/mL), after that, adding 10 parts of PDMS curing agent in and stirring uniformly to obtain a ZnO/PDMS slurry, then using a glass rod for dipping the slurry and coating the slurry on the prepared CNT piezoresistive sensing fiber cloth, after completion, heating and curing at 60° C. for 4 h, and then treating the other side of the CNT piezoresistive sensing fiber cloth according to the same process;

repeating steps 2-5 in Example 1, before coating the ZnO/PDMS piezoelectric functional layer, coating a layer of conductive silver adhesive on the CNT piezoresistive sensing fiber cloth and leading a wire out, then finally obtaining a CNT/ZnO static/dynamic 3D microcrack propagation sensor.

Piezoelectric strain coefficients $d_{33}$ and $d_{31}$ of the polarized CNT/ZnO piezoresistive/piezoelectric sensing 3D microcrack functional skeleton measured by a quasi-static $d_{33}/d_{31}$ measuring instrument are −23 pC/N and −27 pC/N respectively. Combining Wheatstone bridge technology and DaspV11 dynamic signal acquisition technology, the resistivity change of the sensor stuck in the simply supported beam system under the condition of three-point bending at the mid span is studied, and under the action of static strain, the sensitivity is 273 and the linearity is 0.97; under the action of dynamic strain, the sensitivity of sensor voltage change is 98, and the linearity is 0.98, so that the structural strain in the range of 0-60% can be sensitively sensed. 2 kHz dynamic pressure (2.44 kPa) is applied to the sensor to test the cycle stability, and the corresponding output voltage is recorded through the static/dynamic signal acquisition instrument, and the records show that after 5000 cycles, during the whole stability test, the output voltage of the sensor is almost constant, the performance of the sensor is not degraded, the entire sensor remains intact, and no damage is found to the surface flexible seal.

Example 3

The present example provides a method for preparing a static/dynamic 3D microcrack propagation sensor, which differs from Example 1 in that a piezoresistive sensing functional component used is a reduced graphene oxide (rGO); a piezoelectric sensing functional component is a nano-ZnO.

Piezoelectric strain coefficients $d_{33}$ and $d_{31}$ of the polarized rGO/ZnO piezoresistive/piezoelectric sensing 3D microcrack functional skeleton measured by a quasi-static $d_{33}/d_{31}$ measuring instrument are −25 pC/N and −28 pC/N respectively. Combining Wheatstone bridge technology and DaspV11 dynamic signal acquisition technology, the resistivity change of the sensor stuck in the simply supported beam system under the condition of three-point bending at the mid span is studied, and under the action of static strain, the sensitivity is 211 and the linearity is 0.98; under the action of dynamic strain, the sensitivity of sensor voltage change is 220, and the linearity is 0.99, so that the structural strain in the range of 0-60% can be sensitively sensed. 2 kHz dynamic pressure (2.44 kPa) is applied to the sensor to test the cycle stability, and the corresponding output voltage is recorded through the static/dynamic signal acquisition instrument, and the records show that after 5000 cycles, during the whole stability test, the output voltage of the sensor is almost constant, the performance of the sensor is not degraded, the entire sensor remains intact, and no damage is found to the surface flexible seal.

TABLE 1

Comparison of test results of performance static/dynamic 3D microcrack sensor in Examples

| Test Items | | | CN105953821B | CN113074622A | CN111721192B | Example 1 | Example 2 | Example 3 |
|---|---|---|---|---|---|---|---|---|
| Piezoelectric properties | Piezoelectric strain coefficient | $d_{33}$ (pC/N) | −21.5 | — | — | −19.7 | −23.6 | −25.0 |
| | | $d_{31}$ (pC/N) | — | — | — | 32.3 | 29.7 | 28.8 |
| | Sensitivity S (mV/N) | | 22.3 | — | — | 180 | 98 | 220 |
| | Linearity | | 0.977 | — | — | 0.99 | 0.98 | 0.99 |
| Piezoresistive performance | Strain sensitivity GF | | 27.6 | 130 | 150 | 294 | 273 | 211 |
| | Linearity | | 0.959 | 0.9971 | — | 0.99 | 0.97 | 0.98 |
| Strain Sensing Range (%) | | | — | 0-15 | 0.2-16 | 0-60 | 0-60 | 0-60 |

Table 1 shows the comparison of test results of performance static/dynamic 3D microcrack sensor in the above three examples, and after an analysis of the above data, the performance of the static/dynamic 3D microcrack sensors prepared by the three examples of the present invention is superior to that of the sensors prepared by the existing patents CN105953821B, CN113074622A and CN111721192B.

Example 4

The present example provides a static/dynamic 3D microcrack propagation sensor, which is obtained using a method for preparing a static/dynamic 3D microcrack propagation sensor as described in any of the above examples.

Figure 2:
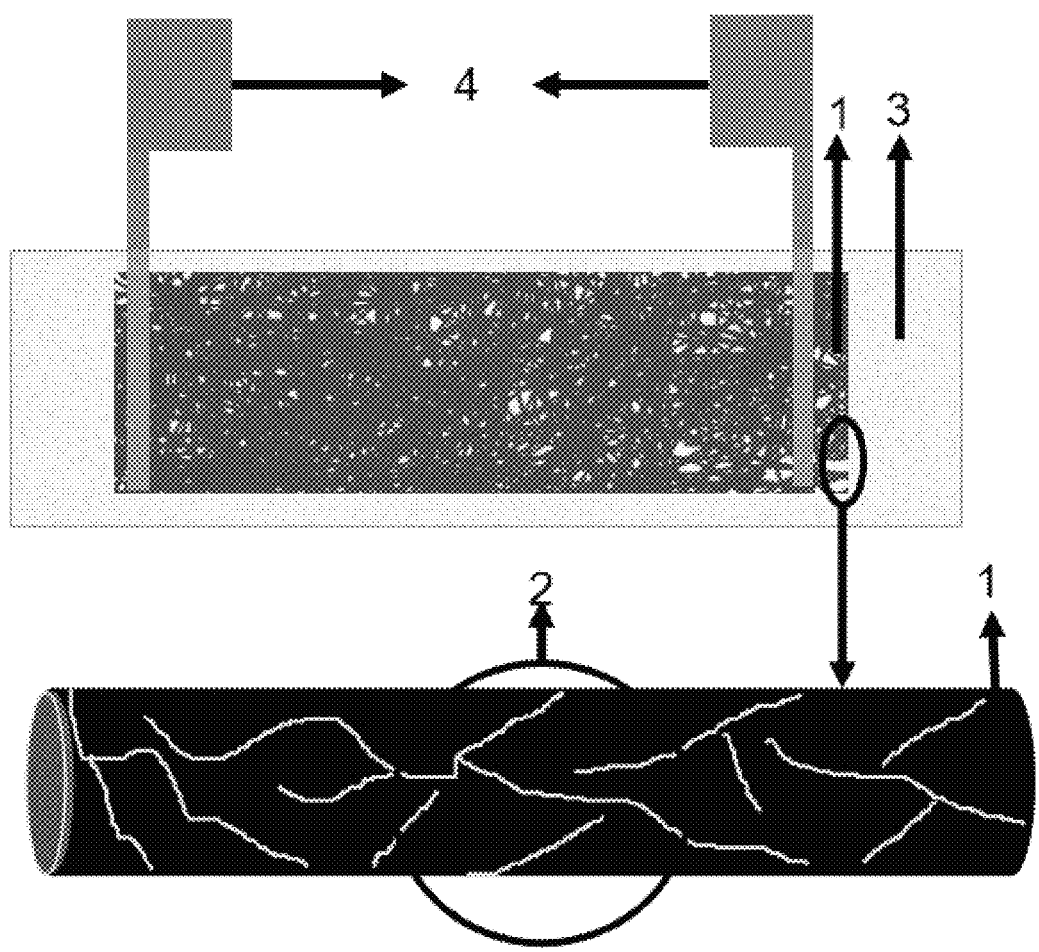
FIG. 2 is a schematic diagram of an enlargement of the static/dynamic 3D microcrack propagation sensor of the example of the present invention.

As shown in FIG. 2, the static/dynamic 3D microcrack propagation sensor of the present example comprises: a piezoresistive/piezoelectric sensing 3D microcrack functional layer 1, a 3D microcrack 2, an encapsulation layer 3, and an electrode 4. Wherein, the piezoresistive/piezoelectric sensing 3D microcrack functional layer 1 contains a top/bottom electrode, and the sensor is connected with the electrode static/dynamic signal acquisition system through wires connected to the top/bottom electrode.

The static/dynamic 3D microcrack propagation sensor of the present example, while introducing piezoresistive and piezoelectric functional components to avoid information loss caused by single-mode sensors in structure monitoring; attaching the piezoresistive/piezoelectric sensing functional component dispersed material to the flexible fiber substrate, then forming a piezoresistive/piezoelectric sensing 3D microcrack functional skeleton by pre-stretching treatment and microwave treatment, functional component skeleton is formed with the fiber structure of the fiber cloth, removing the flexible fiber cloth substrate by microwave ablation, the elastomer can be interwoven with the skeleton through the skeleton gap, which ensure that the sensor may have enough sufficient mechanical stability when the external force is applied, avoiding the problem of the poor mechanical stability of the sensor caused by separation due to the difference in mechanical properties, etc. between the sensing function layer and the flexible fiber cloth substrate or between the sensing function layer and the elastomer, while removing the flexible fiber cloth matrix is beneficial to the improvement of sensitivity; the smaller pre-tension strain can produce 3D microcrack, so that the final prepared sensor can respond to small external disturbances, that is, the change of contact resistance caused by the change of spacing between many 3D microcracks; while the sensing function material may be in a 3D coiled tube shape after the fiber being removed by the microwave ablation, and then the fiber cloth being disposed of by the microwave ablation again and being filled with elastomer to further avoid the failure of the sensor caused by debonding of functional components and fiber cloth under static and dynamic loads; under the triple action, the static/dynamic 3D microcrack propagation sensor has higher sensitivity, which solves the problem that the crack in the sensor layer of the crack sensor is generally a two-dimensional plane structure, limiting the sensor sensitivity. Therefore, the resulting sensor has both high piezoresistive-piezoelectric dual-mode sensitivity and flexibility.

The static/dynamic 3D microcrack propagation sensor of the present example can realize flexible bending at 0-180°, so the sensor can be stuck on the surface or inside of the structure; because the film is flexible, it can flexibly adapt to working surfaces of various shapes, such as suspension bridge cables, shaped steel structures. Meanwhile, the sensor has high static/dynamic dual-mode sensitivity and can respond sensitively to small perturbations, so the sensor can monitor the full frequency domain of displacement or strain changes which the structure suffers.

The foregoing descriptions are merely preferred embodiments of the present invention but are not intended to limit the present invention. A person skilled in art may make various alterations and variations to the present invention. Any modification, equivalent replacement, improvement, etc., made within the spirit and principle of the present invention shall fall within the protection scope of the present invention.

What is claimed is:

1. A method for preparing a static/dynamic 3D microcrack propagation sensor, comprising:
preparing a piezoresistive/piezoelectric sensing functional component dispersed material, and then coating the piezoresistive/piezoelectric sensing functional component dispersed material to a surface of a fiber cloth substrate to obtain a piezoresistive/piezoelectric sensing fiber cloth;
performing a pre-stretching treatment on the piezoresistive/piezoelectric sensing fiber cloth, producing 3D microcrack, then obtaining a piezoresistive/piezoelectric sensing 3D microcrack fiber cloth;
ablating the piezoresistive/piezoelectric sensing 3D microcrack fiber cloth by microwave to remove the fiber cloth substrate, forming a 3D convoluted skeleton, then obtaining a piezoresistive/piezoelectric sensing 3D microcrack functional skeleton;
coating a conductive layer on both surfaces of the piezoresistive/piezoelectric sensing 3D microcrack functional skeleton, thereby forming an electrode;
polarizing the piezoresistive/piezoelectric sensing 3D microcrack functional skeleton with the formed electrodes on the surfaces; and
encapsulating the piezoresistive/piezoelectric sensing 3D microcrack functional skeleton with an elastomer to obtain a static/dynamic 3D microcrack propagation sensor.

2. The method for preparing the static/dynamic 3D microcrack propagation sensor according to claim 1, wherein during the polarization of the piezoresistive/piezoelectric sensing 3D microcrack functional skeleton with the formed electrodes on the surfaces, laminating a conductor with a set thickness and an area thereof equal to an area of a coated silver adhesive on a top of the piezoresistive/piezoelectric sensing 3D microcrack functional skeleton, and then placing them together between a point contact electrode and a bottom electrode of a polarization device for the polarization process.

3. The method for preparing the static/dynamic 3D microcrack propagation sensor according to claim 1, wherein a process of preparing the piezoresistive/piezoelectric sensing functional component dispersed material comprises:
preparing a piezoelectric functional component precursor solution via sol-gel method; and
mixing, dissolving and dispersing materials with piezoresistive function in the piezoelectric functional component precursor solution via surfactant sonication method to obtain the piezoresistive/piezoelectric sensing functional component dispersed material.

4. The method for preparing the static/dynamic 3D microcrack propagation sensor according to claim 1, wherein the conductive layer coated on both surfaces of the piezoresistive/piezoelectric sensing 3D microcrack functional skeleton is a conductive silver adhesive.

5. The method for preparing the static/dynamic 3D microcrack propagation sensor according to claim 1, wherein the piezoresistive functional component is one or a mixture of CNT, GO, GO-grafted carbon fiber, GO-grafted carbon nano fiber, and GnP.

6. The method for preparing the static/dynamic 3D microcrack propagation sensor according to claim 1, wherein the piezoelectric functional component is a PZT precursor/powder, a nano-ZnO precursor/powder, or an aluminum nitride powder;
or, the fiber cloth substrate is a synthetic fabric or a cotton fabric.

7. The method for preparing the static/dynamic 3D microcrack propagation sensor according to claim 1, wherein before coating the conductive layer on both surfaces of the piezoresistive/piezoelectric sensing 3D microcrack functional skeleton, further comprising:
cleaning the piezoresistive/piezoelectric sensing 3D microcrack functional skeleton.

8. The method for preparing the static/dynamic 3D microcrack propagation sensor according to claim 1, wherein after polarizing the piezoresistive/piezoelectric sensing 3D microcrack functional skeleton with the formed electrodes on the surfaces, further comprising:

removing silicone oil from the surfaces of the piezoresistive/piezoelectric sensing 3D microcrack functional skeleton.

9. A static/dynamic 3D microcrack propagation sensor, being obtained by adopting a method for preparing the static/dynamic 3D microcrack propagation sensor of claim 1.

10. A structure monitoring equipment, comprising a static/dynamic 3D microcrack propagation sensor according to claim 9.

* * * * *